(12) United States Patent
Hyun

(10) Patent No.: US 11,257,561 B2
(45) Date of Patent: Feb. 22, 2022

(54) MEMORY DEVICE AND TEST METHOD THEREOF

(71) Applicant: SK hynix Inc., Gyeonggi-do (KR)

(72) Inventor: Sang-Ah Hyun, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/825,625

(22) Filed: Mar. 20, 2020

(65) Prior Publication Data
US 2020/0219578 A1 Jul. 9, 2020

Related U.S. Application Data

(63) Continuation of application No. 15/991,364, filed on May 29, 2018, now Pat. No. 10,636,508.

(30) Foreign Application Priority Data

Dec. 8, 2017 (KR) .......................... 10-2017-0168344

(51) Int. Cl.
| | |
|---|---|
| *G11C 29/12* | (2006.01) |
| *G11C 7/12* | (2006.01) |
| *G11C 7/22* | (2006.01) |
| *G11C 8/08* | (2006.01) |
| *G11C 29/14* | (2006.01) |
| *G11C 29/18* | (2006.01) |
| *G11C 8/18* | (2006.01) |
| *G11C 29/02* | (2006.01) |
| *G11C 29/20* | (2006.01) |
| *G11C 29/46* | (2006.01) |

(52) U.S. Cl.
CPC .......... *G11C 29/12015* (2013.01); *G11C 7/12* (2013.01); *G11C 7/222* (2013.01); *G11C 8/08* (2013.01); *G11C 8/18* (2013.01); *G11C 29/025* (2013.01); *G11C 29/028* (2013.01); *G11C 29/1201* (2013.01); *G11C 29/14* (2013.01); *G11C 29/18* (2013.01); *G11C 29/20* (2013.01); *G11C 29/46* (2013.01); *G11C 2029/1202* (2013.01); *G11C 2029/1204* (2013.01)

(58) Field of Classification Search
CPC . G11C 29/12015; G11C 8/18; G11C 29/1201; G11C 29/18; G11C 8/08; G11C 7/222; G11C 7/12; G11C 29/14; G11C 2029/1202; G11C 2029/1204
See application file for complete search history.

(56) References Cited

U.S. PATENT DOCUMENTS

| | | | | |
|---|---|---|---|---|
| 9,947,384 B1* | 4/2018 | Ka | .......... | G11C 11/408 |
| 2012/0127813 A1* | 5/2012 | Jeong | ...................... | G11C 29/44 365/200 |

(Continued)

*Primary Examiner* — Thien Nguyen
(74) *Attorney, Agent, or Firm* — IP & T Group LLP

(57) ABSTRACT

A semiconductor system includes: a first semiconductor device suitable for outputting a command; and a second semiconductor device suitable for activating a test enable signal based on the command, generating a counting signal representing a toggling number of a row active signal for an activation period of the test enable signal, increasing and outputting an address when the counting signal reaches a target activation number, and deactivating the test enable signal when the counting signal reaches the target activation number and the address has a maximum value.

10 Claims, 14 Drawing Sheets

(56) References Cited

U.S. PATENT DOCUMENTS

| | | | | |
|---|---|---|---|---|
| 2012/0170396 A1* | 7/2012 | Kim | ................... | G11C 11/40626 |
| | | | | 365/222 |
| 2013/0107649 A1* | 5/2013 | Cho | ....................... | G11C 29/46 |
| | | | | 365/201 |
| 2014/0177358 A1* | 6/2014 | Moon | .................... | G11C 7/109 |
| | | | | 365/189.17 |
| 2014/0226423 A1* | 8/2014 | Akamatsu | ................ | G11C 7/12 |
| | | | | 365/201 |
| 2014/0293725 A1* | 10/2014 | Best | ..................... | G11C 11/406 |
| | | | | 365/222 |
| 2015/0206572 A1* | 7/2015 | Lim | ..................... | G11C 11/406 |
| | | | | 365/203 |
| 2017/0192845 A1* | 7/2017 | Kim | ................... | G11C 11/40611 |
| 2018/0090196 A1* | 3/2018 | Ka | ......................... | G11C 11/406 |
| 2018/0218767 A1* | 8/2018 | Wolff | ................ | G11C 11/40615 |

\* cited by examiner

MEMORY DEVICE AND TEST METHOD THEREOF

CROSS-REFERENCE TO RELATED APPLICATIONS

The application is a continuation of U.S. patent application Ser. No. 15/991,364 filed on May 29, 2018, which claims benefits of priority of Korean Patent Application No. 10-2017-0168344 filed on Dec. 8, 2017. The disclosure of each of the foregoing application is incorporated herein by reference in its entirety.

BACKGROUND

1. Field

Various exemplary embodiments of the present invention relate to a semiconductor design technology, and more particularly, to a test operation of a memory device.

2. Description of the Related Art

A memory cell of a memory device is constructed by a cell transistor serving as a switch and a cell capacitor for storing a charge (data). Data of a memory cell is determined as 'high' (logic 1) or 'low' (logic 0) depending on whether a charge is present in the cell capacitor of the memory cell, that is, whether a terminal voltage of the cell capacitor is high or low.

In principle, retention of data does not consume power because retention of data is implemented in such a manner that accumulated charges in a cell capacitor are simply kept there. However, data may be lost because an initial charge stored in a cell capacitor may eventually vanish due to a leakage current attributable to the PN junction of an MOS transistor. Furthermore, as the degree of integration of a memory device continues to increase and the width of line patterns decreases, the capacitance of a cell capacitor is reduced as compared with the capacitance of a bit line capacitor, so that a voltage difference for distinguishing data stored in a memory cell becomes smaller.

When, during a write operation, data cannot be sufficiently stored in a memory cell having a small capacitance cell capacitor there is increased risk of an intermittent tWR failure (hereinafter, referred to as an intermittent failure). "tWR" denotes a write recovery time, which is the minimum time required for data to be written to a memory cell during the write operation.

An intermittent failure, which is a failure caused by an intermittent increase in the tWR, does occur rather irregularly and not continuously in any specific cell. Hence, it is difficult to prevent an intermittent failure through a typical refresh operation. Furthermore, since the intermittent failure may also occur in a memory cell which is not detected as a defective cell through a test, it may be difficult to prevent the intermittent failure through a conventional test and repair.

A method of screening such an intermittent failure is proposed. The method typically includes repeatedly applying stress to a word line by repeatedly generating an active command and a precharge command using a command applied from a burn-in test device.

SUMMARY

Various embodiments are directed to a memory device and a method capable of screening an intermittent failure.

In accordance with an embodiment of the present invention, a semiconductor system includes: a first semiconductor device suitable for outputting a command; and a second semiconductor device suitable for activating a test enable signal based on the command, generating a counting signal representing a toggling number of a row active signal for an activation period of the test enable signal, increasing and outputting an address when the counting signal reaches a target activation number, and deactivating the test enable signal when the counting signal reaches the target activation number and the address has a maximum value.

In accordance with an embodiment of the present invention, a memory device includes: n address generation block suitable for generating a counting signal by counting a toggling number of a row active signal based on a test enable signal, and increasing and outputting an address whenever the counting signal reaches a target activation number; a test control block suitable for activating the test enable signal based on a command, and deactivating the test enable signal when the counting signal reaches the target activation number while the address has a maximum value; an internal command generation block suitable for generating the row active signal that toggles for an activation period of the test enable signal; and a row control block coupled to a memory array region through a plurality of word lines, and suitable for activating and deactivating a word line corresponding to the address in response to the row active signal.

In accordance with an embodiment of the present invention, a test method of a memory device includes: activating a test enable signal based on a first command; generating a row active signal that toggles for an activation period of the test enable signal; generating a counting signal by counting a toggling number of the row active signal, and increasing and outputting an address whenever the counting signal reaches a number of times of target activation; and deactivating the test enable signal when the counting signal reaches the target activation number while the address has a maximum value after a second command is inputted.

These and other features and advantages of the present invention will become apparent to those with ordinary skill in the art to which the present invention belongs from the following description in conjunction with the accompanying drawings.

DETAILED DESCRIPTION

Figure 1A:
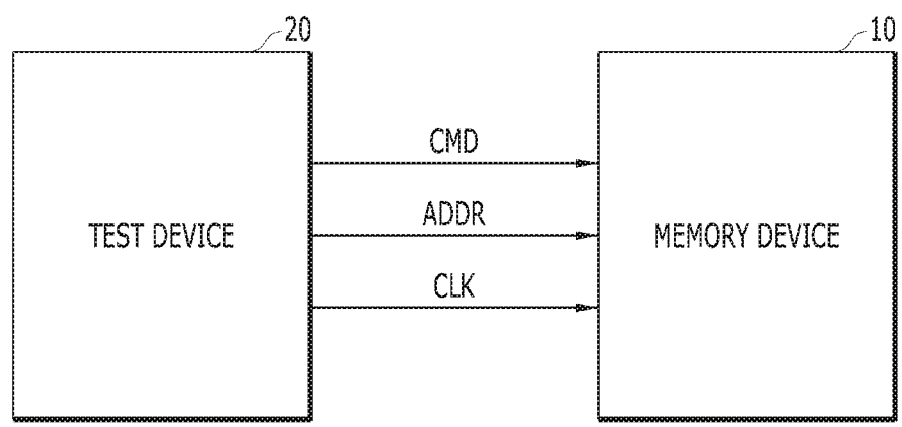
FIGS. 1A and 1B are a simplified block diagram and a timing diagram, respectively, illustrating a memory device performing a general test operation.

Various exemplary embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the present invention.

In describing the invention, when it is determined that the detailed description of the known related art may obscure the gist of the present disclosure, the detailed description thereof will be omitted.

Although the terms such as first and second may be used to describe various components, the components are not limited by these terms, and the terms are used only to distinguish components from other components.

The terminology used herein is for the purpose of describing particular embodiments of the invention only and is not intended to limit the invention. As used herein, singular forms may also include the plural forms as well, unless the context clearly indicates otherwise.

It will be further understood that the terms "comprises", "comprising", "includes", and "including" as used herein, specify the presence of the stated elements and do not preclude the presence or addition of one or more other elements. Also, as used herein, the term "and/or" includes any and all combinations of one or more of the associated listed items.

In the following description, numerous specific details are set forth in order to provide a thorough understanding of the present invention. It is noted, however, that the present invention may be practiced without some or all of these specific details. In other instances, well-known process structures and/or processes are not described in detail to avoid unnecessarily obscuring the invention.

It is further noted, as would be apparent to those skilled in the relevant art, that in some instances a feature or element described in connection with an embodiment may be used singly or in combination with other features or elements of another embodiment, unless otherwise specifically indicated.

Figure 1B:
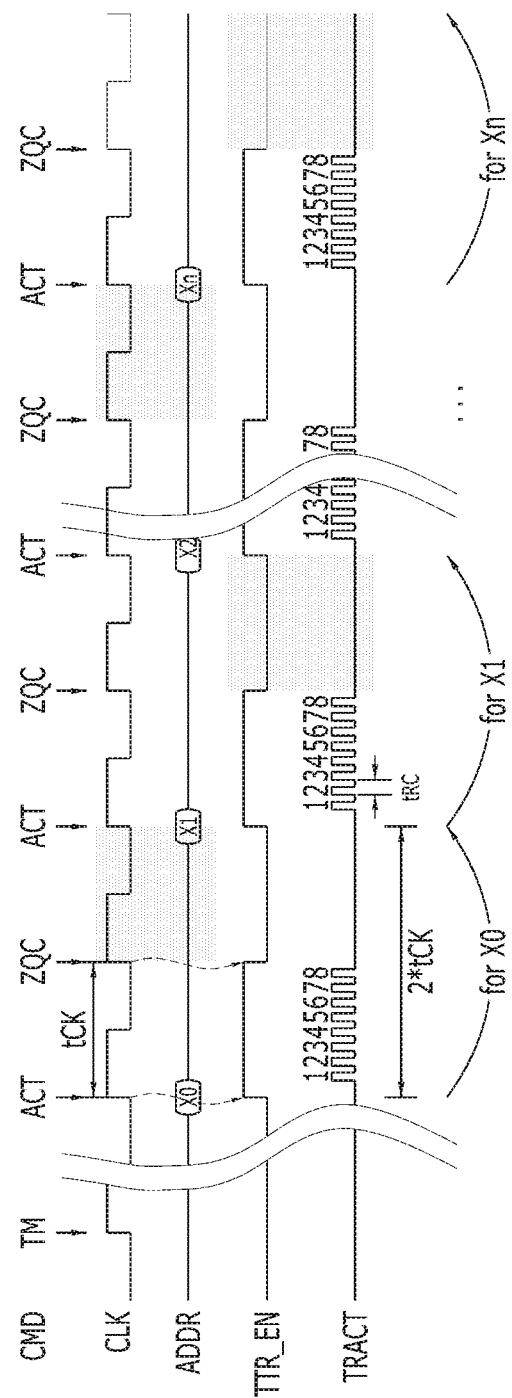

FIGS. 1A and 1B are a simplified block diagram and a timing diagram, respectively, illustrating a memory device 10 performing a general test operation.

Referring to FIGS. 1A and 1B, a test device 20 such as a burn-in test device provides a clock CLK, a command CMD and an address ADDR to the memory device 10. In an embodiment, the command CMD and the address ADDR may be transmitted continuously or simultaneously as a command address signal through the same transmission line. In another embodiment, the command CMD and the address ADDR may be transmitted simultaneously as separate command and address signals through separate transmission lines. The command CMD for performing a test operation may include a test command TM, an active command ACT and a calibration command ZQC. The calibration command ZQC inputted during the test operation may be used as a command for completing an operation corresponding to the active command ACT inputted previously instead of a command for performing a conventional calibration operation. The clock CLK, is a signal for synchronizing operations of the test device 20 and the memory device 10. The clock CLK may be generated as a signal that toggles with a tCK cycle.

The memory device 10 receives the clock CLK, the command CMD and the address ADDR and then generates internal commands TTR_EN and TRACT and internal addresses X0 to Xn. The memory device 10 may latch the address ADDR inputted together with the active command ACT to generate the internal addresses X0 to Xn.

The memory device 10 may generate a test enable signal TTR_EN that is activated in response to the active command ACT inputted after the test command TM is applied and is deactivated in response to the calibration command ZQC. The test enable signal TTR_EN may be set to be activated to perform the test operation which includes applying stress by repeatedly inputting/outputting data to a plurality of memory cells of the memory device 10.

The memory device 10 repeatedly generates an internal active command and an internal precharge command during an activation period of the test enable signal TTR_EN. The reference symbol "TRACT" of FIG. 1B designates a row active signal which is activated in response to the internal active command and deactivated in response to the internal precharge command. It is illustrated in FIG. 1B that the row active signal TRACT for one internal address is repeatedly activated and deactivated eight times.

A time from when the internal active command is activated until a subsequent internal active command is activated may be defined as a row cycle time (hereinafter, referred to as a "tRC"), and when 1*tCK is approximately 300 ns in FIG. 1A, the tRC may be set to approximately 300 ns/8=37.5 ns. Accordingly, the memory device 10 may repeatedly activate and deactivate the row active signal TRACT for a word line corresponding to a single internal address during 2*tCK, thereby applying a successive stress.

However, the aforementioned test method may have the following issues.

In order to test each internal address, the active command ACT and the calibration command ZQC have to be inputted each time. That is, a time of (n+1)*(2*tCK) Is required for testing $(n+1)^{th}$ internal addresses. Hence, a substantial amount of time may be unnecessarily wasted regardless of the test operation.

Also, since the test device 20 such as the burn-in test device operates on a low tCK base, the memory device 100 may repeatedly activate and deactivate the row active signal TRACT for a predetermined number of times by using an oscillator included inside. The oscillator may be implemented by a ring oscillator delay (ROD) circuit. Since a cycle of an internal clock generated by the ROD circuit varies according to process, voltage and temperature (PVT) conditions, the oscillator may generate the row active signal TRACT that toggles a different number of times than an actual set number of times, e.g., eight times, for the activation period of the test enable signal TTR_EN. For example, although the row active signal TRACT is set to be repeatedly activated and deactivated eight times during 1*tCK, e.g., approximately 300 ns, that is, the tRC is set to approximately 37.5 ns, the row active signal TRACT may be repeatedly activated and deactivated seven or nine times.

Hereinafter, a method of maintaining a predetermined number of stress applications even if the cycle of the internal clock varies according to the PVT while reducing the time required for the test operation will be provided. For the sake of convenience in description, a semiconductor system including a configuration related to the test operation will be described.

Figure 2:
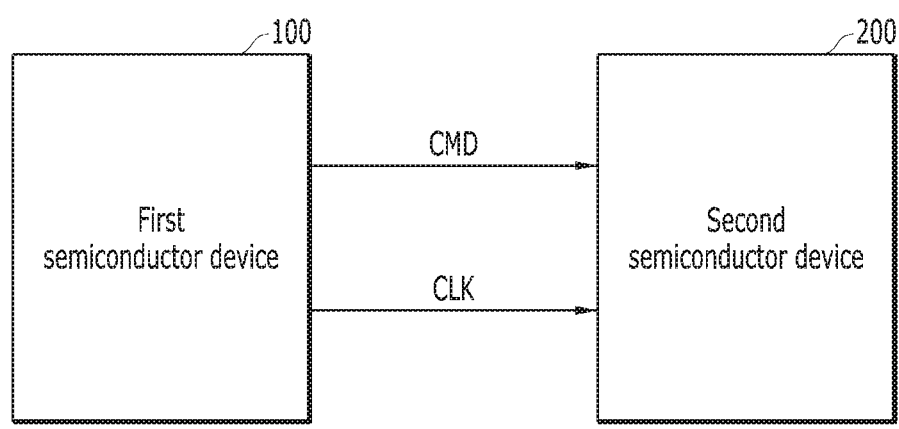
FIG. 2 is a simplified block diagram illustrating a semiconductor system comprising first and second semiconductor devices performing a test operation in accordance with a first embodiment of the present invention.
Figure 3:
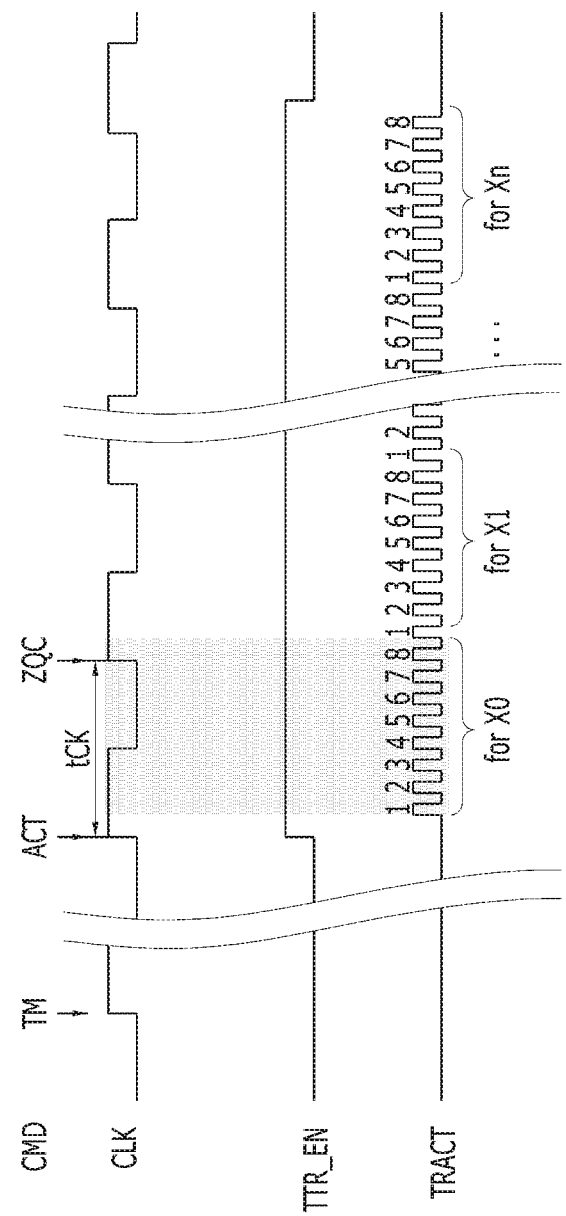
FIG. 3 is a timing diagram illustrating a test operation of the semiconductor system shown in FIG. 2.

FIG. 2 is a simplified block diagram illustrating a semiconductor system performing a test operation in accordance with an embodiment of the present invention. FIG. 3 is a timing diagram illustrating the test operation of the semiconductor system shown in FIG. 2.

Referring to FIG. 2, the semiconductor system may include a first semiconductor device 100 and a second semiconductor device 200. The first semiconductor device 100 may include a controller for controlling an operation of the second semiconductor device 200 and/or a test device for testing the second semiconductor device 200 and repairing one or more defective memory cells. The second semiconductor device 200 may include a memory device including a plurality of memory cells.

In operation, the first semiconductor device 100 may output a command CMD to the second semiconductor device 200. The first semiconductor device 100 may output the command CMD based on a clock CLK that toggles with a tCK cycle for synchronizing the operation of the second semiconductor device 200. The command CMD for performing the test operation may include a test command TM, an active command ACT, and a calibration command ZQC. According to the embodiment of the invention, the first semiconductor device 100 does not provide an address to the second semiconductor device 200 during the test operation.

Referring to FIG. 3, the second semiconductor device 200 may activate a test enable signal TTR_EN based on the command CMD received from the first semiconductor device 100. For example, the second semiconductor device 200 may activate the test enable signal TTR_EN in response to the active command ACT inputted after the test command TM is applied.

The second semiconductor device 200 may count a toggling number of a row active signal TRACT for an activation period of the test enable signal TTR_EN to generate a counting signal (not illustrated) and output internal addresses X0 to Xn that are increased by 1 bit when the counting signal reaches a number equal to a target activation number, e.g., 8. In addition, the second semiconductor device 200 may deactivate the test enable signal TTR_EN when the counting signal reaches the target activation number while the internal addresses X0 to Xn have a maximum value. In this case, the first semiconductor device 100 may output the calibration command ZQC to the second semiconductor device 200 subsequent to the active command ACT in consideration of the toggling number of the row active signal TRACT and a row cycle time tRC for each of the internal addresses X0 to Xn.

Conventionally, the test operation may be performed only on a word line corresponding to a latched address after an address inputted from an external device is latched. However, according to the present invention, unnecessary time for inputting a command and an address for address change is eliminated during an entire test required time by automatically generating an address counted internally, whereby the test operation may be efficiently performed. For example, the number of commands applied for testing in FIG. 3 is remarkably reduced compared to FIG. 1B, and the test time required in FIG. 3 is tRC*(n+1), which is reduced by half compared to the test time required in FIG. 1B.

In addition, since an active-precharge operation for a subsequent address is performed after the active-precharge operation corresponding to the target activation number, which is set in advance, for a current address is completed, evaluation reliability may be improved by maintaining a predetermined number of stress applications even if the cycle of the internal clock varies according to the PVT.

Hereinafter, a specific configuration for implementing the present invention will be described. For the sake of convenience in description, a configuration related to a row is mainly shown in the drawing.

Figure 4:
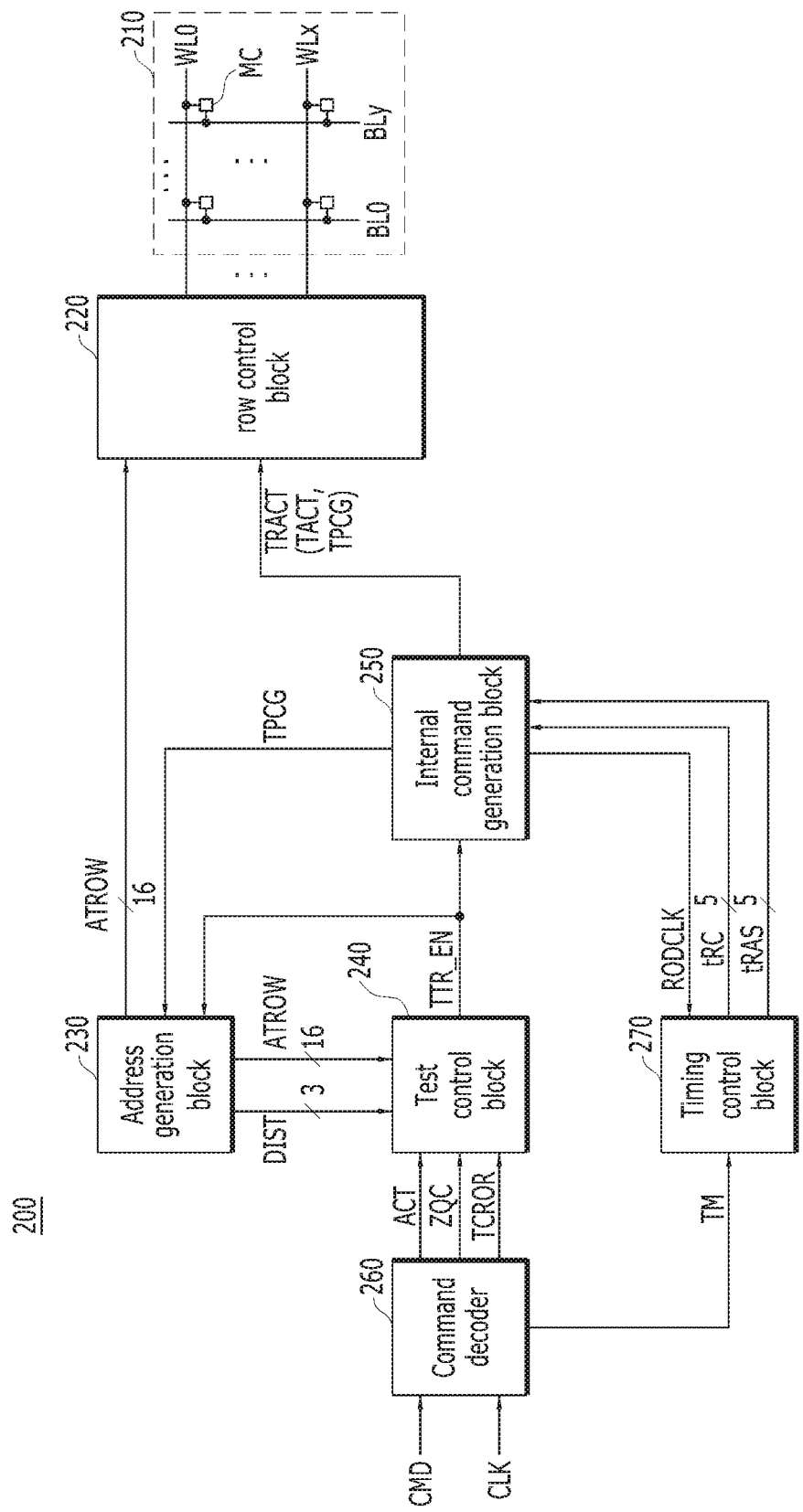
FIG. 4 is a simplified block diagram illustrating an exemplary configuration of the second semiconductor device shown in FIG. 2.

FIG. 4 is a simplified block diagram illustrating an exemplary configuration of the second semiconductor device 200 shown in FIG. 2.

Referring to FIG. 4, the second semiconductor device 200 may include a memory array region 210, a row control block 220, an address generation block 230, a test control block 240, an internal command generation block 250, a command decoder 260, and a timing control block 270.

The memory array region 210 may include a plurality of word lines WL0 to WLx, where x is a natural number, a plurality of bit lines BL0 to BLy, where y is a natural number, and a plurality of memory cells MC coupled between the word lines and the bit lines.

The row control block 220 may be coupled to the memory array region 210 through the word lines WL0 to WLx. The row control block 220 may activate and deactivate a word line corresponding to a row address ATROW in response to the row active signal TRACT.

The command decoder 260 may receive and decode the command CMD based on the clock CLK to generate the test command TM, the active command ACT and the calibration command ZQC.

Also, the command decoder 260 may generate a test mode signal TCROR which is activated when the test command TM is inputted and is deactivated based on a reset signal (not illustrated) inputted after the test operation is completed.

The address generation block 230 may generate a counting signal DIST by counting the toggling number of the row active signal TRACT based on the test enable signal TTR_EN received from the test control block 240, increase the row address ATROW whenever the counting signal DIST reaches the target activation number which is set in advance, and output an increased row address ATROW to the test control block 240. The address generation block 230 may generate the counting signal DIST that increases based on a falling edge of the row active signal TRACT, that is, activation of an internal precharge command TPCG received from the internal command generation block 250. In other words, as the counting signal DIST is generated using the internal precharge command TPCG instead of an internal active command TACT, a timing margin with the row address ATROW generated subsequently may be secured.

Hereinafter, it is described as an example that the counting signal DIST is a 3-bit signal, and the row address ATROW is a 16-bit address. Also, we note that a specific signal or address having a maximum value means that all bits of the signal or address have a logic high level.

The test control block 240 may activate the test enable signal TTR_EN based on the active command ACT received from the command decoder 260 and deactivate the test enable signal TTR_EN when the counting signal DIST reaches the target activation number while the row address ATROW has the maximum value. Particularly, the test control block 240 shown in the first embodiment of the present invention may deactivate the test enable signal TTR_EN when the row address ATROW has the maximum value and the counting signal DIST reaches the target activation number after the calibration command ZQC is inputted from the command decoder 260.

The internal command generation block 250 may generate the row active signal TRACT that toggles for the activation period of the test enable signal TTR_EN. In other words, the internal command generation block 250 may generate the internal active command TACT and the internal precharge command TPCG based on timing parameters tRC and tRAS when the test enable signal TTR_EN is activated and output the row active signal TRACT which is activated in response to the internal active command TACT and deactivated in response to the internal precharge command TPCG. Besides, the internal command generation block 250 may generate a cycle signal RODCLK that is used for an internal clock. The internal command generation block 250 may include an oscillator (not illustrated) embodied in an ROD circuit whose cycle varies according to the PVT. Accordingly, pulse widths of the row active signal TRACT and cycle signal RODCLK may vary according to the PVT.

The timing control block 270 may output the timing parameters tRC and tRAS, which are set, when the test command TM is inputted from the command decoder 260. The timing control block 270 may output the timing parameters tRC and tRAS based on the internal clock, i.e., the cycle signal RODCLK. The timing parameters tRC and tRAS may include the row cycle time tRC which is the time until a subsequent internal active command is activated after an internal active command specified in the pertinent JEDEC regulation is activated, and a row active time tRAS which is the time until an internal precharge command is activated after the internal active command is activated. Hereinafter, for the sake of convenience in description, it is described as an example that each of the timing parameters tRC and tRAS is a 5-bit signal.

Figure 5:
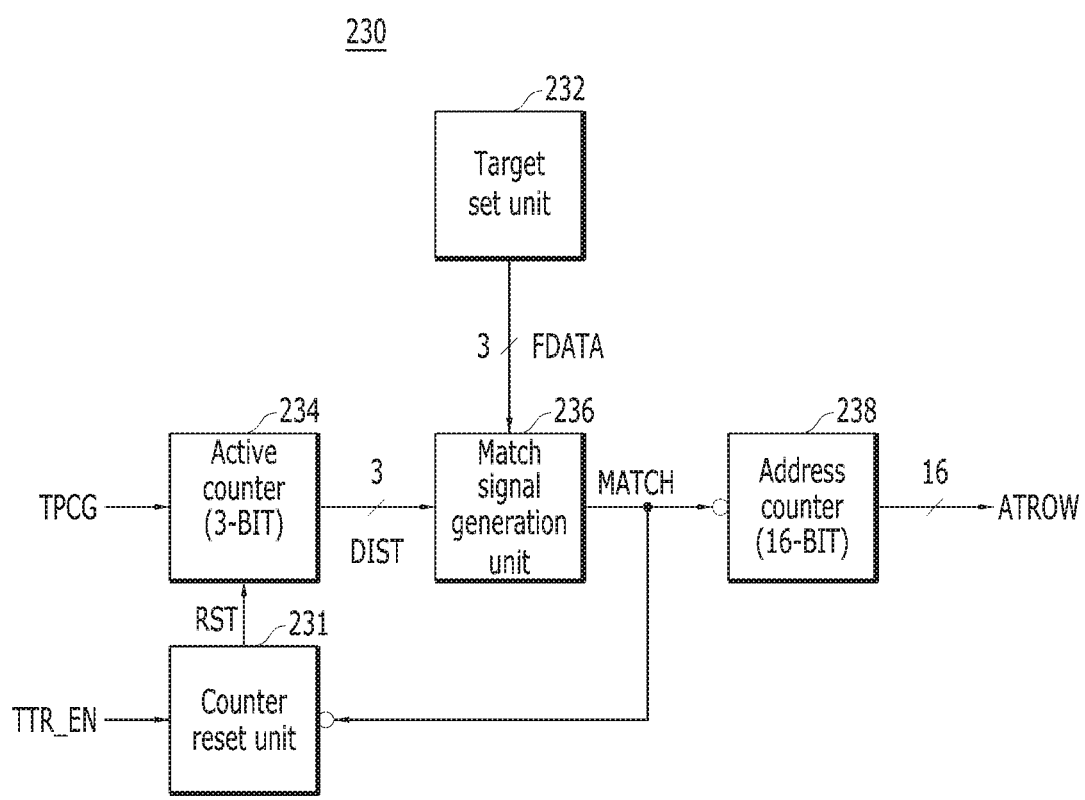
FIG. 5 is a simplified block diagram illustrating an address generation block shown in FIG. 4.

FIG. 5 is a simplified block diagram illustrating an exemplary configuration of the address generation block 230 shown in FIG. 4.

Referring to FIG. 5, the address generation block 230 may include a counter reset unit 231, a target set unit 232, an active counter 234, a match signal generation unit 236, and an address counter 238.

The counter reset unit 231 may generate a counter reset signal RST that is activated for a predetermined period at a rising edge of the test enable signal TTR_EN or a falling edge of a match signal MATCH. That is, the counter reset unit 231 may activate the test enable signal TTR_EN or activate the counter reset signal RST for the predetermined period whenever the match signal MATCH is deactivated.

The target set unit 232 may store a target activation number FDATA. The target set unit 232 may be, for example, implemented with fuses that program the target activation number FDATA inside according to fuse cutting. Preferably, the target activation number FDATA may be composed of the same 3-bit signal as the counting signal DIST. For example, the target activation number FDATA may be set to a value ranging from 0 to 7. Hereinafter, a case where the target activation number FDATA is set to "111" is described as an example.

The active counter 234 may be reset based on the counter reset signal RST received from the counter reset unit 231 and count the toggling number of the row active signal TRACT to generate the counting signal DIST. Particularly, the active counter 234 may generate the counting signal DIST that increases based on the falling edge of the row active signal TRACT, i.e., the activation of the internal precharge command TPCG, thereby securing the timing margin with the row address ATROW generated subsequently. The active counter 234 may be, for example, implemented with a 3-bit counter, and be reset to "000" based on the test enable signal TTR_EN, thereby generating the 3-bit counting signal DIST having a value ranging from "000" to "111".

The match signal generation unit 236 may generate the match signal MATCH when the counting signal DIST matches the target activation number FDATA. For example, the match signal generation unit 236 may activate the match signal MATCH when the counting signal DIST becomes "111," i.e., equal to the target activation number FDATA.

The address counter 238 may increase the 16-bit row address ATROW by 1 bit when the match signal MATCH is inputted from the match signal generation unit 236 and output an increased row address ATROW. The address counter 238 may be, for example, implemented with a 16-bit counter, and increase the 16-bit row address ATROW by 1 bit in response to the falling edge of the match signal MATCH, thereby outputting the increased row address ATROW as a 16-bit address signal having a value ranging from "0000" to "FFFF".

Figure 6:
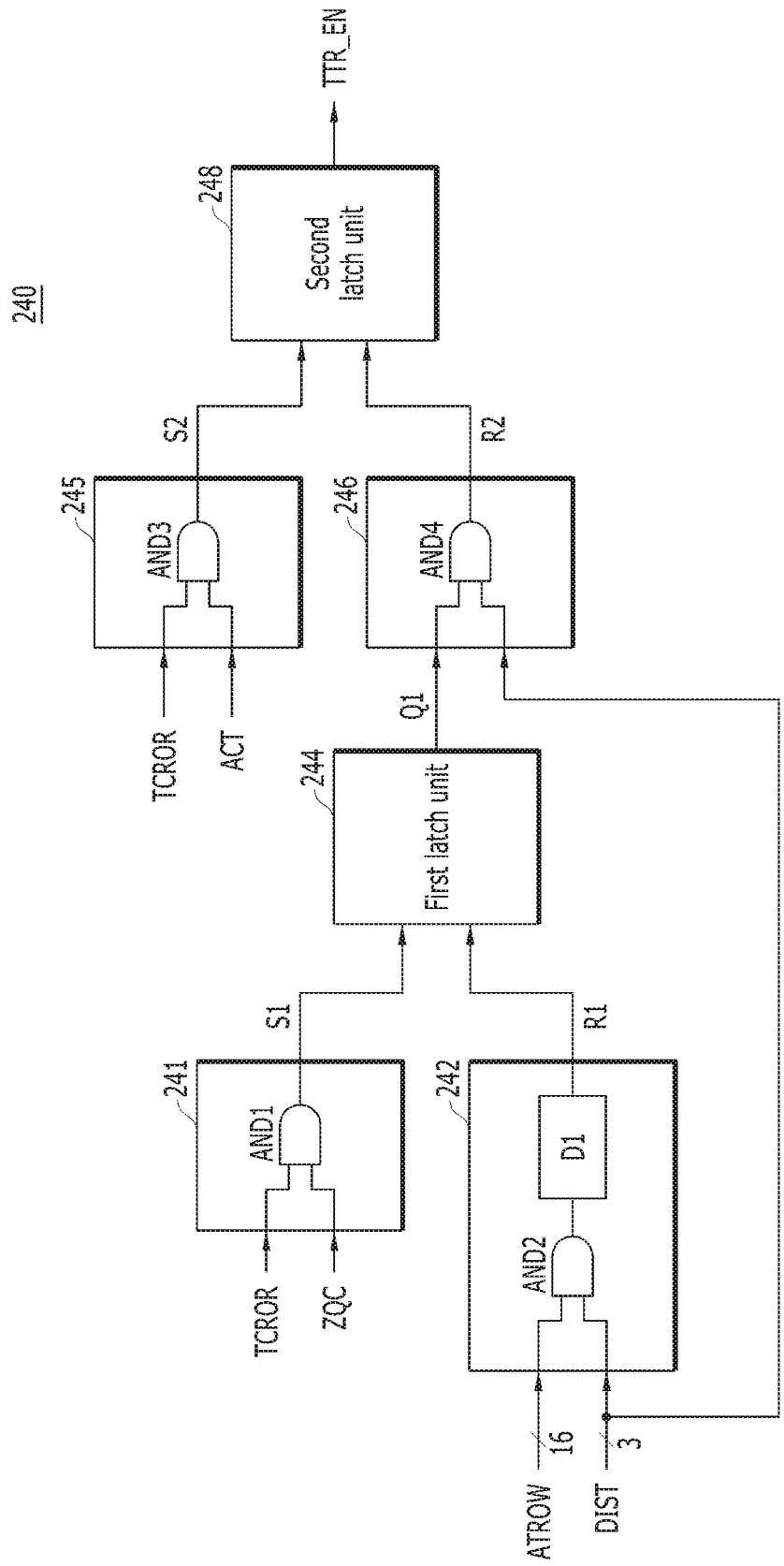
FIG. 6 is a simplified block diagram illustrating a test control block shown in FIG. 4.

FIG. 6 is a simplified block diagram illustrating an exemplary configuration of the test control block 240 shown in FIG. 4.

Referring to FIG. 6, the test control block 240 may include a first set signal generation unit 241, a first reset signal generation unit 242, a first latch unit 244, a second set signal generation unit 245, a second reset signal generation unit 246, and a second latch unit 248.

The first set signal generation unit 241 may activate and output a first set signal S1 when the calibration command ZQC is activated while the test mode signal TCROR is activated. The first set signal generation unit 241 may be, for example, implemented with an AND gate AND1 that performs an AND operation on the test mode signal TCROR and the calibration command ZQC received from the command decoder 260.

The first reset signal generation unit 242 may generate a first reset signal R1 when the counting signal DIST reaches the target activation number while the row address ATROW has the maximum value. In other words, the first reset signal generation unit 242 may activate the first reset signal R1 when the 16 bits of the row address ATROW and the 3 bits of the counting signal DIST become logic high. The first reset signal generation unit 242 may be, for example, implemented with an AND gate AND2 that performs an AND operation on each bit of the row address ATROW and each bit of the counting signal DIST and a delay D1 that delays an output of the AND gate AND2 by a predetermined time D.

The first latch unit 244 may be set in response to the first set signal S1 and output a latch signal Q1 that is reset in response to the first reset signal R1. The first latch unit 244 may be, for example, implemented with an RS latch. For example, the first latch unit 244 may be an RS NAND latch or an RS NOR latch.

The second set signal generation unit 245 may activate and output a second set signal S2 when the active command ACT is inputted while the test mode signal TCROR is activated. The second set signal generation unit 245 may be, for example, implemented with an AND gate AND3 that performs an AND operation on the test mode signal TCROR and the active command ACT received from the command decoder 260.

The second reset signal generation unit 246 may generate a second reset signal R2 when the counting signal DIST reaches the target activation number while the latch signal Q1 is activated. The second reset signal generation unit 246 may be, for example, implemented with an AND gate AND4 that performs an AND operation on each bit of the counting signal DIST and the latch signal Q1.

The second latch unit 248 may be set in response to the second set signal S2 and output the test enable signal TTR_EN that is reset in response to the second reset signal R2. The second latch unit 248 may be, for example, implemented with an RS latch.

Figure 7:
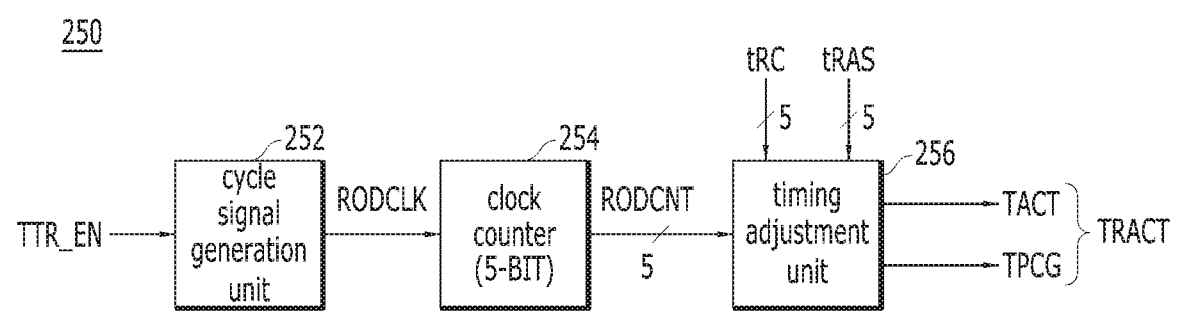
FIG. 7 is a simplified block diagram illustrating an internal command generation block shown in FIG. 4.

FIG. 7 is a simplified block diagram illustrating an exemplary configuration of the internal command generation block 250 shown in FIG. 4.

Referring to FIG. 7, the internal command generation block 250 may include a cycle signal generation unit 252, a clock counter 254, and a timing adjustment unit 256.

The cycle signal generation unit 252 may generate the cycle signal RODCLK that toggles when the test enable signal TTR_EN is inputted. The cycle signal generation unit 252 may include an oscillator (not illustrated) embodied in an ROD circuit whose cycle varies according to the PVT. Accordingly, a pulse width of the cycle signal RODCLK may vary according to the PVT.

The clock counter 254 may count the cycle signal RODCLK to generate a cycle counting signal RODCNT. The clock counter 254 may be, for example, implemented with a 5-bit counter, and count a toggling number of the cycle signal RODCLK, thereby generating the 5-bit cycle counting signal RODCNT having a value ranging from "00000" to "11111".

The timing adjustment unit 256 may adjust timing of the cycle counting signal RODCNT based on the timing parameters tRC and tRAS to generate the internal active command TACT and the internal precharge command TPCG, and output the row active signal TRACT which is activated in response to the internal active command TACT and deactivated in response to the internal precharge command TPCG. The timing adjustment unit 256 may output the internal active command TACT by adjusting the timing of the cycle counting signal RODCNT based on the timing parameter tRC which is a 5-bit signal, and generate the internal precharge command TPCG by adjusting the timing of the cycle counting signal RODCNT based on the timing parameter tRAS which is a 5-bit signal.

Hereinafter, a test operation of a semiconductor system in accordance with an embodiment of the invention will be described with reference to FIGS. 2 to 8.

Figure 8:
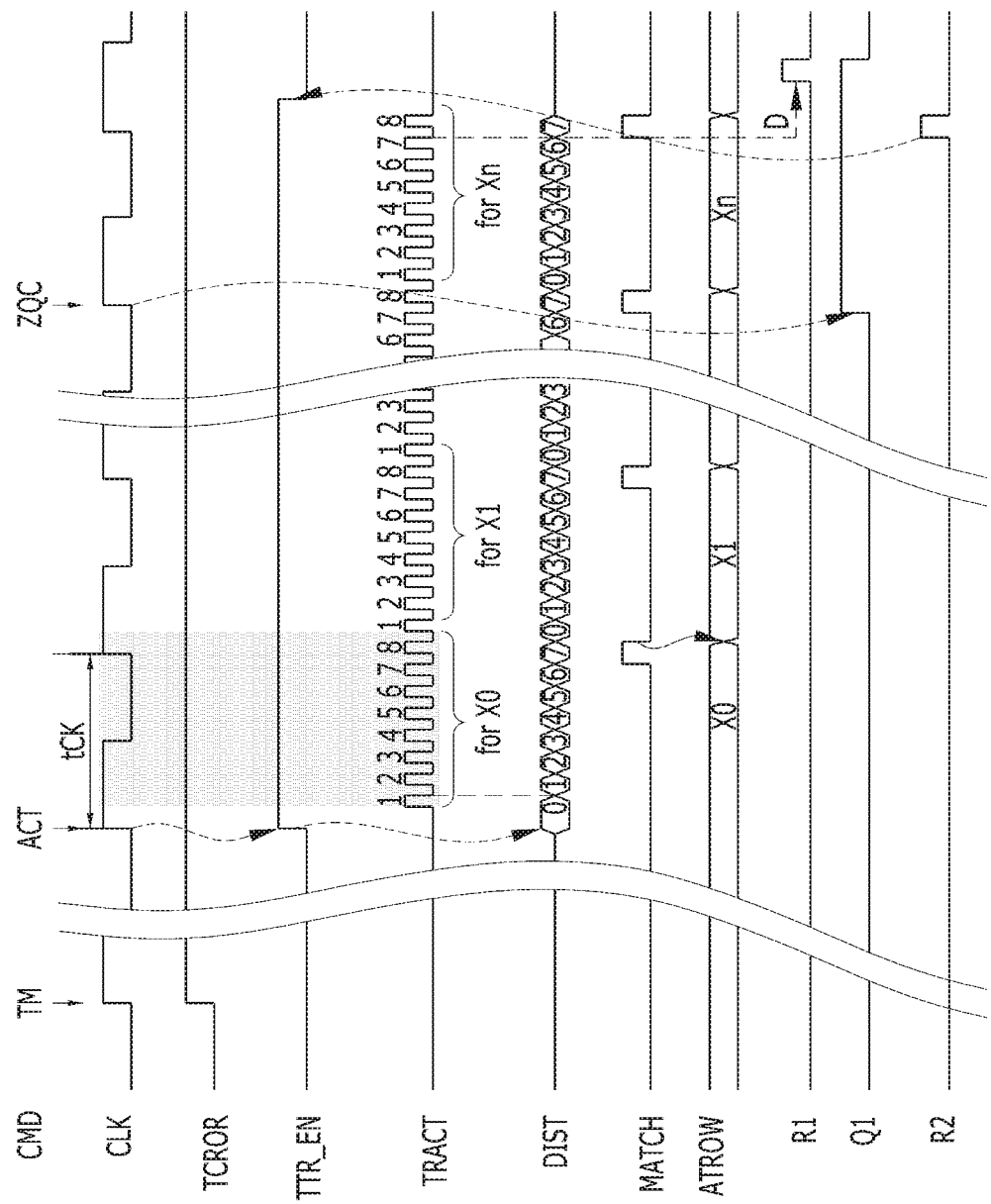
FIG. 8 is a timing diagram illustrating a test operation of a semiconductor system in accordance with an embodiment of the present invention.

FIG. 8 is a timing diagram illustrating the test operation of the semiconductor system in accordance with the first embodiment of the present invention.

Referring to FIG. 8, the first semiconductor device 100 may transmit the test command TM notifying a test mode entry to the second semiconductor device 200. In response to the test command TM, the command decoder 260 of the second semiconductor device 200 may activate the test mode signal TCROR, and the timing control block 270 may output the set timing parameters tRC and tRAS.

The second set signal generation unit 245 of the test control block 240 may activate the second set signal S2 when the active command ACT is inputted while the test mode signal TCROR is activated, and the second latch unit 248 may activate the test enable signal TTR_EN in response to the second set signal S2. The test enable signal TTR_EN may be set to a signal which is activated to perform the test operation of applying stress by repeatedly inputting/outputting data to/from the memory cells of the second semiconductor device 200.

The internal command generation block 250 may generate the row active signal TRACT that toggles for the activation period of the test enable signal TTR_EN.

The active counter 234 of the address generation block 230 may reset the counting signal DIST to "000" in response to the rising edge of the test enable signal TTR_EN, and count the toggling number of the row active signal TRACT to generate the counting signal DIST. Particularly, the active counter 234 may generate the counting signal DIST that increases based on the falling edge of the row active signal TRACT, that is, the activation of the internal precharge command TPCG. The match signal generation unit 236 may activate the match signal MATCH when the counting signal DIST becomes "111" equal to the number of times of target activation FDATA. The address counter 238 may increase the 16-bit row address ATROW by 1 bit in response to the falling edge of the match signal MATCH and output the increased row address ATROW. The active counter 234 may reset the counting signal DIST to "000" in response to the falling edge of the match signal MATCH, that is, whenever the match signal MATCH is deactivated, and may count the toggling number of the row active signal TRACT to generate the counting signal DIST.

Subsequently, the first set signal generation unit 241 of the test control block 240 may activate and output the first set signal S1 when the calibration command ZQC is activated while the test mode signal TCROR is activated. The first latch unit 244 may activate the latch signal Q1 in response to the first set signal S1.

The first reset signal generation unit 242 may generate the first reset signal R1 after the predetermined time D is delayed when the counting signal DIST reaches the target activation number while the row address ATROW has the maximum value, that is, the last row address Xn is generated. The first latch unit 244 may deactivate the latch signal Q1 in response to the first reset signal R1.

The second reset signal generation unit 246 may activate the second reset signal R2 when the counting signal DIST reaches the target activation number while the latch signal Q1 is activated. The second latch unit 248 may deactivate the test enable signal TRR_EN in response to the second reset signal R2.

As described above, in accordance with the embodiment of the present invention, the row address ATROW may be automatically counted and generated internally, hence an unnecessary time for inputting a command and an address for address change is eliminated during an entire test time, thereby effectively performing the test operation. Furthermore, after the active-precharge operation corresponding to the target activation number, e.g., 8 times, which may be set in advance, is completed for one row address ATROW, the active-precharge operation may be started for a subsequent row address ATROW. Hence, the invention makes it possible to maintain a predetermined number of stress applications even if the cycle of the internal clock varies according to the PVT.

In the first embodiment of the invention, a case where the test command TM, the active command ACT and the calibration command ZQC are applied from the first semiconductor device to the second semiconductor device is described as above. Hereinafter, a case where the calibration command ZQC is not applied from the first semiconductor device to the second semiconductor device, and the second semiconductor device provides a test termination signal to the first semiconductor device after the test operation is internally completed will be described in accordance with a second embodiment of the present invention. In the second embodiment, descriptions of configurations and operations overlapping with those of the first embodiment are omitted.

Figure 9:
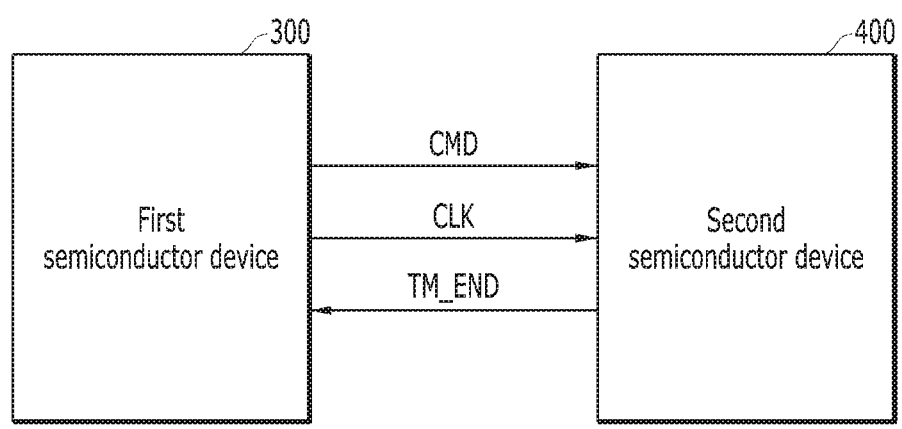
FIG. 9 is a simplified block diagram illustrating a semiconductor system comprising first and second semiconductor devices performing a test operation in accordance with an embodiment of the present invention.

FIG. 9 is a simplified block diagram illustrating a semiconductor system performing a test operation in accordance with an embodiment of the present invention.

Referring to FIG. 9, the semiconductor system may include a first semiconductor device 300 and a second semiconductor device 400.

The first semiconductor device 300 may provide a command CMD and a clock CLK to the second semiconductor device 400. The command CMD for performing the test operation may include a test command TM and an activation command ACT. According to the invention, the first semiconductor device 300 does not provide an address to the second semiconductor device 400 during the test operation.

The second semiconductor device 400 does not receive a calibration command ZQC from the first semiconductor device 300. Instead, the second semiconductor device 400 may provide a test termination signal TM_END to the first semiconductor device 300 after the test operation is internally performed. For example, the second semiconductor device 400 may transmit the test termination signal TM_END to the first semiconductor device 300 through a conventional data pad (not illustrated), not through a separate pin or pad.

Figure 10:
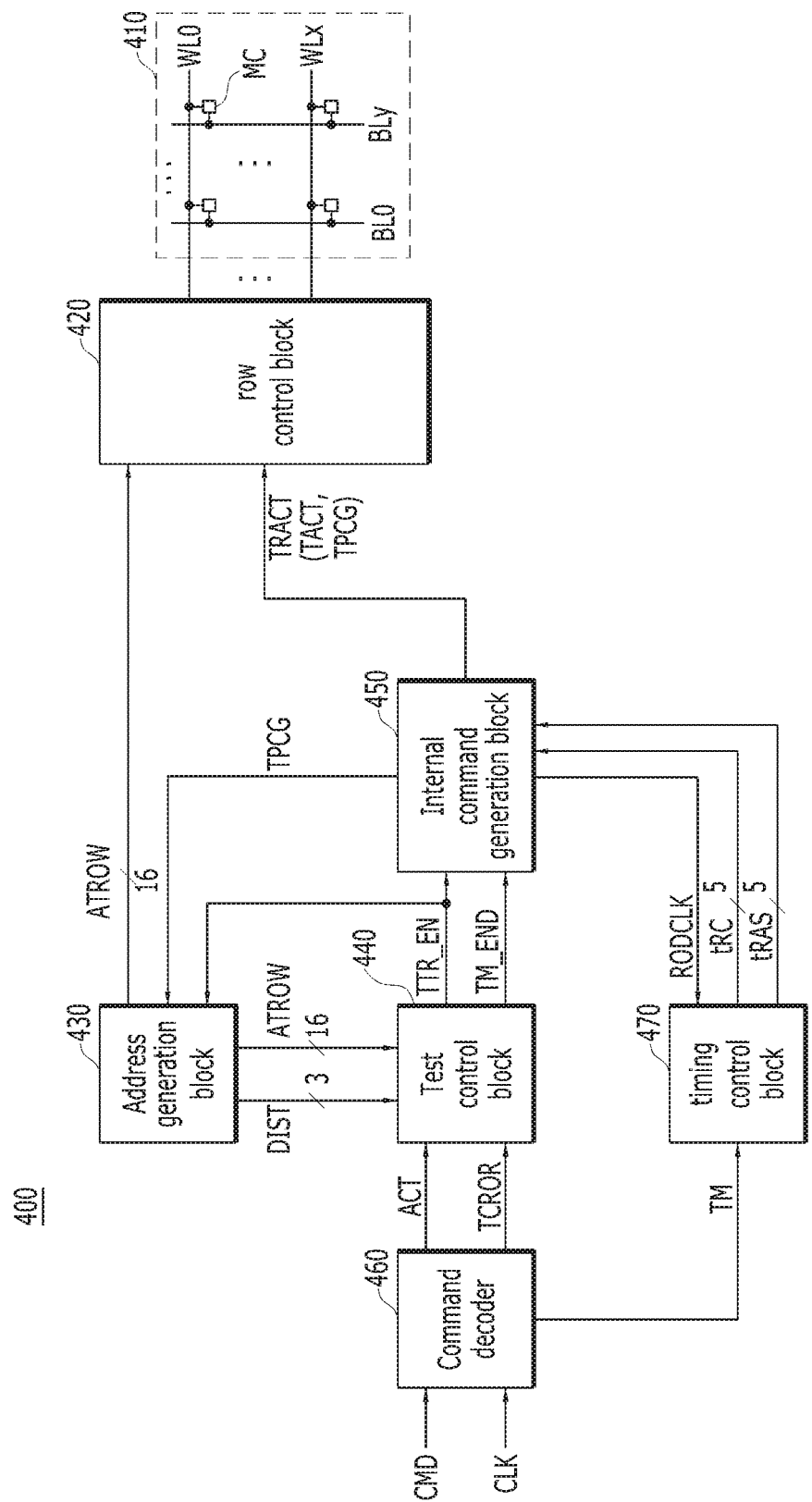
FIG. 10 is a simplified block diagram illustrating an exemplary configuration of the second semiconductor device shown in FIG. 9.

FIG. 10 is a simplified block diagram illustrating an exemplary configuration of the second semiconductor device 400 shown in FIG. 9.

Referring to FIG. 10, the second semiconductor device 400 may include a memory array region 410, a row control block 420, an address generation block 430, a test control block 440, an internal command generation block 450, a command decoder 460, and a timing control block 470.

Detailed descriptions of the components and configurations of the memory array region 410, the row control block 420, the address generation block 430 and the timing control block 470 that are substantially the same as those of the memory array region 210, the row control block 220, the address generation block 230 and the timing control block 270 shown in FIG. 4 are omitted.

The command decoder 460 may receive and decode the command CMD based on the clock CLK to generate the test command TM and the active command ACT. Also, the command decoder 460 may generate a test mode signal TCROR which is activated when the test command TM is inputted and deactivated based on a reset signal (not illustrated) inputted after the test operation is completed.

The test control block 440 may activate a test enable signal TTR_EN based on the active command ACT and deactivate the test enable signal TTR_EN when a counting signal DIST reaches the target activation number while a row address ATROW has a maximum value.

Particularly, the test control block 440 shown in the second embodiment of the present invention may activate the test termination signal TM_END when the counting signal DIST reaches the target activation number while the row address ATROW has the maximum value, and therefore deactivate the test enable signal TTR_EN.

The Internal command generation block 450 may generate a row active signal TRACT that toggles for an activation period of the test enable signal TTR_EN and suspend generation of the row active signal TRACT based on the test termination signal TM_END.

Figure 11:
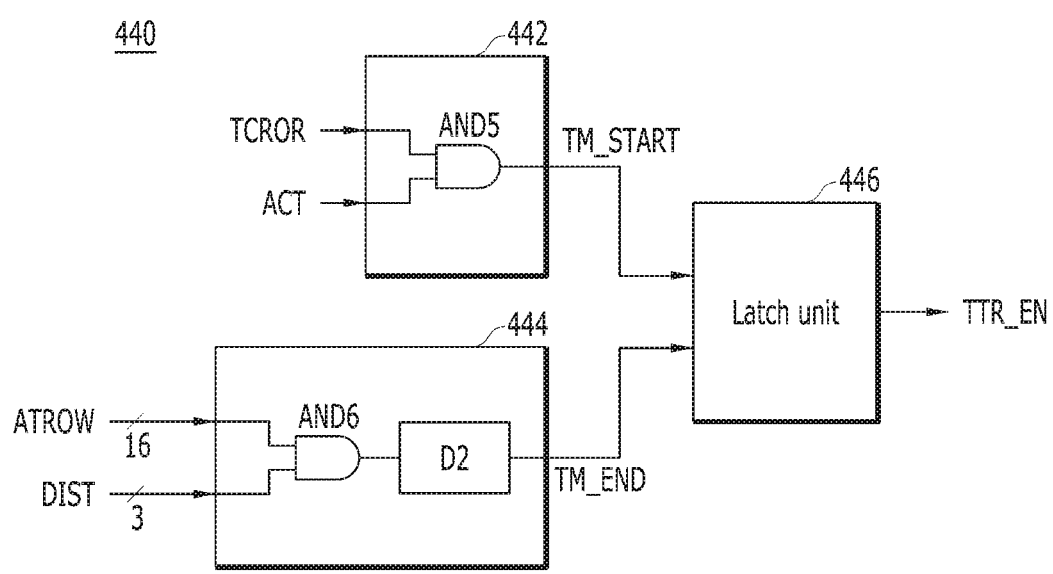
FIG. 11 is a simplified block diagram illustrating a test control block shown in FIG. 10.

FIG. 11 is a simplified block diagram illustrating an exemplary configuration of the test control block 440 shown in FIG. 10.

Referring to FIG. 11, the test control block 440 may include a start signal generation unit 442, a termination signal generation unit 444, and a latch unit 446.

The start signal generation unit 442 may activate and output a test start signal TM_START when the active command ACT is inputted while the test mode signal TCROR is activated. The start signal generation unit 442 may be, for example, implemented with an AND gate AND5 that performs an AND operation on the inputted test mode signal TCROR and the active command ACT.

The termination signal generation unit 444 may generate the test termination signal TM_END when the counting signal DIST reaches the target activation number while the row address ATROW has the maximum value. In other words, the termination signal generation unit 444 may activate the test termination signal TM_END when 16 bits of the row address ATROW and 3 bits of the counting signal DIST are a logic high level. The termination signal generation unit 444 may be, for example, implemented with an AND gate AND6 that performs an AND operation on each bit of the row address ATROW and each bit of the counting signal and a delay D2 that delays an output of the AND gate AND6 by a predetermined time D.

The latch unit 446 may output the test enable signal TTR_EN which is set in response to the test start signal TM_START and reset in response to the test termination signal TM_END. The latch unit 446 may be, for example, implemented with an RS latch.

Figure 12:
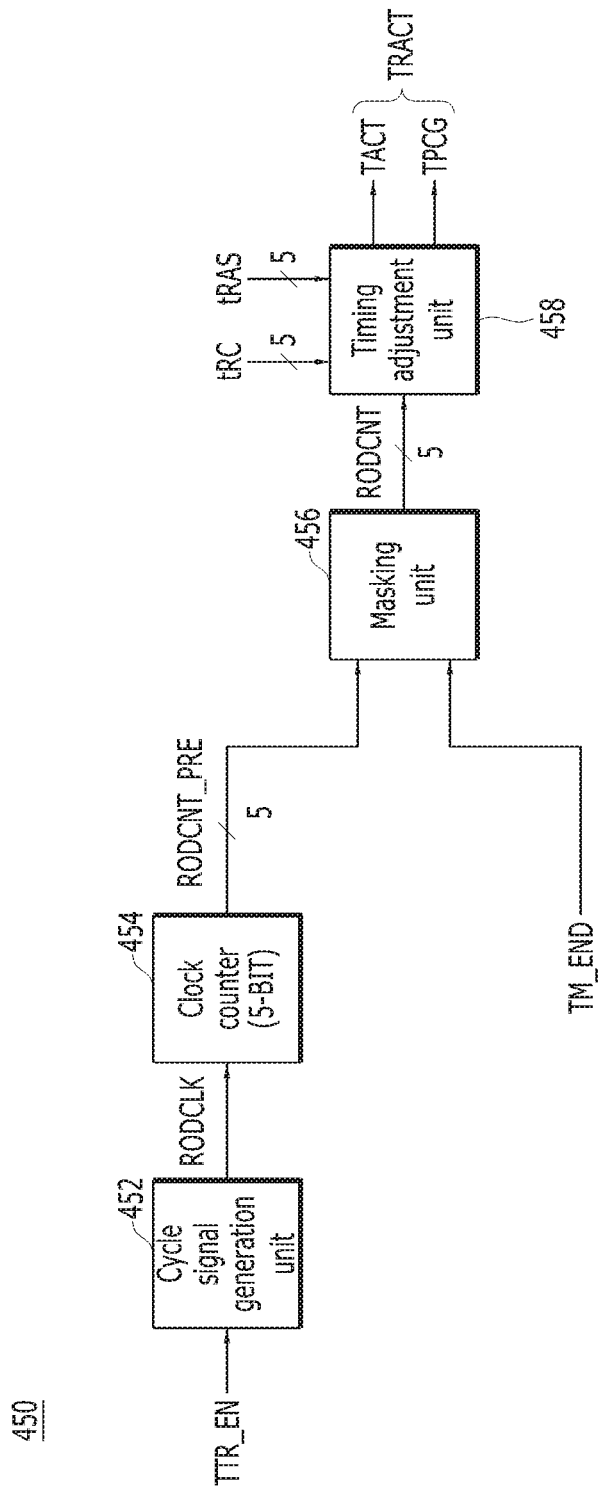
FIG. 12 is a simplified block diagram illustrating an internal command generation block shown in FIG. 10.

FIG. 12 is a simplified block diagram illustrating an exemplary configuration of the internal command generation block 450 shown in FIG. 10.

Referring to FIG. 12, the internal command generation block 450 may include a cycle signal generation unit 452, a clock counter 454, a masking unit 456, and a timing adjustment unit 458.

The cycle signal generation unit 452 may generate a cycle signal RODCLK that toggles when the test enable signal TTR_EN is inputted. The cycle signal generation unit 452 may include an oscillator (not illustrated) embodied in an ROD circuit whose cycle varies according to the PVT. Accordingly, a pulse width of the cycle signal RODCLK may vary according to the PVT.

The clock counter 454 may count the cycle signal RODCLK to generate a preliminary cycle counting signal RODCNT_PRE. The clock counter 454 may be, for example, implemented with a 5-bit counter, and may count a toggling number of the cycle signal RODCLK, thereby generating the preliminary cycle counting signal RODCNT_PRE of 5 bits having a value ranging from "00000" to "11111".

The masking unit 456 may mask the preliminary cycle counting signal RODCNT_PRE based on the test termination signal TM_END to output a cycle counting signal RODCNT. In other words, the masking unit 456 may mask the preliminary cycle counting signal RODCNT_PRE so that the cycle counting signal RODCNT is not outputted when the counting signal DIST reaches the target activation number and the test termination signal TM_END is activated while the row address ATROW has the maximum value.

The timing adjustment unit 458 may adjust timing of the cycle counting signal RODCNT based on the timing parameters tRC and tRAS to generate an internal active command TACT and an internal precharge command TPCG, and output the row active signal TRACT which is activated in response to the internal active command TACT and deactivated in response to the internal precharge command TPCG.

Hereinafter, a test operation of a semiconductor system of an embodiment of the invention will be described with reference to FIGS. 9 to 13.

Figure 13:
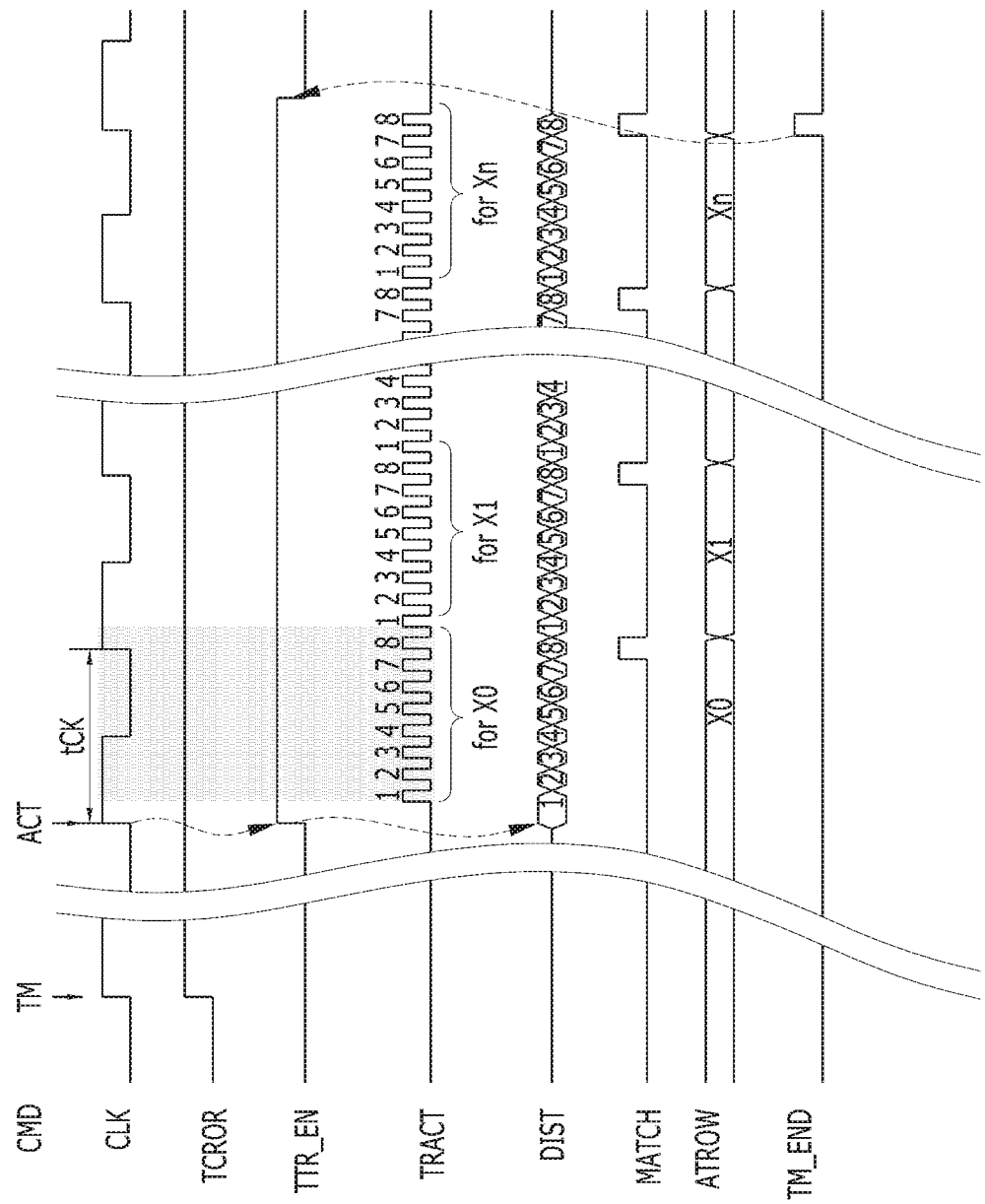
FIG. 13 is a timing diagram illustrating a test operation of a semiconductor system in accordance with an embodiment of the present invention.

FIG. 13 is a timing diagram illustrating a test operation of the semiconductor system in accordance with the second embodiment of the present invention.

Referring to FIG. 13, the first semiconductor device 300 may transmit the test command TM notifying a test mode entry to the second semiconductor device 400. In response to the test command TM, the command decoder 460 of the second semiconductor device 400 may activate the test mode signal TCROR, and the timing control block 470 may output the set timing parameters tRC and tRAS.

The start signal generation unit 442 of the test control block 440 may activate the test start signal TM_START when the active command ACT is inputted while the test mode signal TCROR is activated, and the latch unit 446 may activate the test enable signal TTR_EN in response to the test start signal TM_START.

The internal command generation block 450 may generate the row active signal TRACT that toggles for the activation period of the test enable signal TTR_EN.

The address generation block 430 may reset the counting signal DIST to "000" in response to a rising edge of the test enable signal TTR_EN, and count a toggling number of the row active signal TRACT to generate the counting signal DIST. Also, the address generation block 430 may activate a match signal MATCH when the counting signal DIST becomes "111" equal to target activation number FDATA. The address generation block 430 may increase the 16-bit row address ATROW by 1 bit in response to a falling edge of the match signal MATCH and output an increased row address ATROW. The address generation block 430 may reset the counting signal DIST to "000" in response to the falling edge of the match signal MATCH, that is, whenever the match signal MATCH is deactivated, and may count the toggling number of the row active signal TRACT to generate the counting signal DIST.

Subsequently, the termination signal generation unit 444 of the test control block 440 may generate the test termination signal TM_END when the counting signal DIST reaches the target activation number while the row address ATROW has the maximum value. The latch unit 446 may deactivate the test enable signal TTR_EN in response to the test termination signal TM_END.

As the test enable signal TTR_EN is deactivated, the internal command generation block 450 may deactivate the row active signal TRACT, and the address generation block 430 may suspend generation of the row address ATROW. Accordingly, the second semiconductor device 400 may complete the test operation.

The second semiconductor device 400 may provide the test termination signal TM_END to the first semiconductor device 300, thereby notifying that the test operation is completed.

As demonstrated above, the invention provides an improved test operation for screening an intermittent failure. More specifically the invention provides an improved device and method for performing a test operation for an intermittent failure by eliminating an unnecessary time for applying a command and an address from a test device to a memory device for address change.

Also, in accordance with embodiments of the invention as described above, the invention is advantageous in that, during a test operation for screening an intermittent failure, evaluation reliability may be improved by maintaining a predetermined number of stress applications even when a cycle of an internal clock of a memory device may vary according to PVT.

Although various exemplary embodiments have been described for illustrative purposes, it will be apparent to those skilled in the art that various changes and modifications may be made without departing from the spirit and scope of the invention as defined in the following claims.

What is claimed is:

1. A semiconductor system comprising:
 a first semiconductor device configured to output a first command and a second command; and
 a second semiconductor device including:
  an address generation circuit configured to generate a counting signal representing a toggling number of a row active signal based on a test enable signal, and increase and output an address whenever the counting signal reaches a target activation number;
  a first reset signal generation circuit configured to generate a first reset signal when the counting signal reaches the target activation number while the address has a maximum value;
  a first latch circuit configured to output a latch signal which is set in response to the second command and reset in response to the first reset signal;
  a second reset signal generation circuit configured to generate a second reset signal when the counting signal reaches the target activation number while the latch signal is activated;
  a second latch circuit configured to output the test enable signal which is set in response to the first command and reset in response to the second reset signal; and
  an internal command generation circuit configured to generate the row active signal that toggles for an activation period of the test enable signal.

2. The semiconductor system of claim 1, wherein the address generation circuit includes:
 a counter reset circuit configured to generate a counter reset signal which is activated for a predetermined period at a rising edge of the test enable signal or a falling edge of a match signal;
 an active counter that is reset based on the counter reset signal and counts the toggling number of the row active signal to generate the counting signal;
 a match signal generation circuit configured to generate the match signal when the target activation number matches the counting signal; and
 an address counter configured to increase and output the address when the match signal is inputted.

3. A semiconductor system comprising:
 a first semiconductor device configured to output a command; and
 a second semiconductor device including:
  an address generation circuit configured to generate a counting signal representing a toggling number of a row active signal based on a test enable signal, and increase and output an address whenever the counting signal reaches a target activation number;
a termination signal generation circuit configured to generate a termination signal when the counting signal reaches the target activation number while the address has a maximum value;
a latch configured to output the test enable signal which is set in response to the command and reset in response to the termination signal; and
an internal command generation circuit configured to generate the row active signal that toggles for an activation period of the test enable signal.

4. The semiconductor system of claim 3, wherein the internal command generation circuit suspends generation of the row active signal based on the termination signal.

5. A memory device comprising:
an address generation circuit configured to generate a counting signal representing a toggling number of a row active signal based on a test enable signal, and increase and output an address whenever the counting signal reaches a target activation number;
a first reset signal generation circuit configured to generate a first reset signal when the counting signal reaches the target activation number while the address has a maximum value;
a first latch circuit configured to output a latch signal which is set in response to a second command inputted after a first command and reset in response to the first reset signal;
a second reset signal generation circuit configured to generate a second reset signal when the counting signal reaches the target activation number while the latch signal is activated;
a second latch circuit configured to output the test enable signal which is set in response to the first command and reset in response to the second reset signal;
an internal command generation circuit configured to generate the row active signal that toggles for an activation period of the test enable signal; and
a row control circuit coupled to a memory array region through a plurality of word lines, and configured to activate and deactivate a word line corresponding to the address in response to the row active signal.

6. The memory device of claim 5, wherein the address generation circuit includes:
a counter reset circuit configured to generate a counter reset signal which is activated for a predetermined period at a rising edge of the test enable signal or a falling edge of a match signal;
an active counter that is reset based on the counter reset signal, and counts the toggling number of the row active signal to generate the counting signal;
a match signal generation circuit configured to generate the match signal when the target activation number matches the counting signal; and
an address counter configured to increase and output the address when the match signal is inputted.

7. The memory device of claim 5, wherein the internal command generation circuit includes:
a cycle signal generation circuit configured to generate a cycle signal that toggles when the test enable signal is inputted;
a clock counter configured to count the cycle signal to generate a cycle counting signal; and
a timing adjustment circuit configured to adjust timing of the cycle counting signal based on timing parameters to generate the row active signal.

8. The memory device of claim 7, wherein the timing parameters include a row cycle time (tRC) and a row active time (tRAS).

9. A memory device comprising:
an address generation circuit configured to generate a counting signal representing a toggling number of a row active signal based on a test enable signal, and increase and output an address whenever the counting signal reaches a target activation number;
a termination signal generation circuit configured to generate a termination signal when the counting signal reaches the target activation number while the address has a maximum value;
a latch configured to output the test enable signal which is set in response to the command and reset in response to the termination signal;
an internal command generation circuit configured to generate the row active signal that toggles for an activation period of the test enable signal; and
a row control circuit coupled to a memory array region through a plurality of word lines, and configured to activate and deactivate a word line corresponding to the address in response to the row active signal.

10. The memory device of claim 9, wherein the internal command generation circuit includes:
a cycle signal generation circuit configured to generate a cycle signal that toggles when the test enable signal is inputted;
a clock counter configured to count the cycle signal to generate a preliminary cycle counting signal;
a masking circuit configured to mask the preliminary cycle counting signal based on the termination signal to output a cycle counting signal; and
a timing adjustment circuit configured to adjust timing of the cycle counting signal based on timing parameters to generate the row active signal.

* * * * *